(12) United States Patent
Song et al.

(10) Patent No.: US 11,653,544 B2
(45) Date of Patent: *May 16, 2023

(54) ORGANIC LIGHT EMITTING DISPLAY AND MANUFACTURING METHOD THEREOF

(71) Applicant: Samsung Display Co., Ltd., Yongin-si (KR)

(72) Inventors: Ok Keun Song, Yongin-si (KR); Sung Soo Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 66 days.

This patent is subject to a terminal disclaimer.

(21) Appl. No.: 17/316,919

(22) Filed: May 11, 2021

(65) Prior Publication Data

US 2021/0280640 A1    Sep. 9, 2021

Related U.S. Application Data

(63) Continuation of application No. 16/991,721, filed on Aug. 12, 2020, now Pat. No. 11,049,912, which is a
(Continued)

(30) Foreign Application Priority Data

Dec. 9, 2014   (KR) .................. 10-2014-0175994

(51) Int. Cl.
*H01L 27/32*     (2006.01)
*H01L 51/00*     (2006.01)
(Continued)

(52) U.S. Cl.
CPC ........ *H01L 27/322* (2013.01); *H01L 51/5036* (2013.01); *H01L 51/5278* (2013.01); *H01L 51/0067* (2013.01); *H01L 2251/301* (2013.01); *H01L 2251/303* (2013.01); *H01L 2251/5315* (2013.01); *H01L 2251/5369* (2013.01)

(58) Field of Classification Search
CPC .............. H01L 27/322; H01L 51/5036; H01L 51/5278; H01L 2251/5369; H01L 2251/5315; H01L 51/0067; H01L 2251/303; H01L 2251/301
See application file for complete search history.

(56) References Cited

U.S. PATENT DOCUMENTS 7,525,129 B2   4/2009   Masuda et al.
8,247,086 B2   8/2012   Inoue et al.
(Continued)

FOREIGN PATENT DOCUMENTS

JP    2005-267990 A    9/2005
JP    2014-027162 A    2/2014
(Continued)

*Primary Examiner* — Kyoung Lee
(74) *Attorney, Agent, or Firm* — Lewis Roca Rothgerber Christie LLP

(57) ABSTRACT

An organic light emitting display including a substrate, a first electrode and a second electrode on the substrate and facing each other, at least two organic light emitting layers between the first electrode and the second electrode, and at least two color filters on the second electrode, the organic light emitting layers emitting a first color light, and the color filters emitting a second color light and a third color light.

16 Claims, 6 Drawing Sheets

Related U.S. Application Data continuation of application No. 16/547,776, filed on Aug. 22, 2019, now Pat. No. 10,804,335, which is a continuation of application No. 16/163,839, filed on Oct. 18, 2018, now Pat. No. 10,403,688, which is a continuation of application No. 15/661,409, filed on Jul. 27, 2017, now Pat. No. 10,109,685, which is a continuation of application No. 14/712,190, filed on May 14, 2015, now Pat. No. 9,722,001.

(51) Int. Cl.
    *H01L 51/50*     (2006.01)
    *H01L 51/52*     (2006.01)

(56) References Cited

U.S. PATENT DOCUMENTS

| | | | |
|---|---|---|---|
| 8,841,653 | B2 | 9/2014 | Shitagaki et al. |
| 10,411,212 | B2 | 9/2019 | Kambe et al. |
| 10,600,846 | B1 | 3/2020 | Lin et al. |
| 10,804,335 | B2 | 10/2020 | Song et al. |
| 11,049,912 | B2 * | 6/2021 | Song .................... H01L 51/5036 |
| 2005/0206305 | A1 | 9/2005 | Masuda et al. |
| 2008/0224605 | A1 | 9/2008 | Noh et al. |
| 2008/0268282 | A1 | 10/2008 | Spindler et al. |
| 2009/0153942 | A1 | 6/2009 | Daniel et al. |
| 2010/0123152 | A1 | 5/2010 | Sugisawa et al. |
| 2011/0193130 | A1 | 8/2011 | Naijo |
| 2012/0242218 | A1 | 9/2012 | Yoshinaga et al. |
| 2013/0228757 | A1 | 9/2013 | Su et al. |
| 2014/0084266 | A1 | 3/2014 | Yang et al. |
| 2014/0192294 | A1 | 7/2014 | Chen et al. |
| 2014/0246663 | A1 | 9/2014 | Kambe et al. |

FOREIGN PATENT DOCUMENTS

| | | |
|---|---|---|
| KR | 10-2010-0108535 A | 10/2010 |
| KR | 10-2012-0113876 A | 10/2012 |
| KR | 10-2013-0008892 A | 1/2013 |
| KR | 10-2014-0085433 A | 7/2014 |

\* cited by examiner

ORGANIC LIGHT EMITTING DISPLAY AND MANUFACTURING METHOD THEREOF

CROSS-REFERENCE TO RELATED APPLICATIONS

This application is a continuation of application Ser. No. 16/991,721, filed Aug. 12, 2020, which is a continuation of application Ser. No. 16/547,776, filed Aug. 22, 2019, now U.S. Pat. No. 10,804,335, issued Oct. 13, 2020, which is a continuation of application Ser. No. 16/163,839, filed Oct. 18, 2018, now U.S. Pat. No. 10,403,688, issued Sep. 3, 2019, which in turn is a continuation of application Ser. No. 15/661,409, filed Jul. 27, 2017, now U.S. Pat. No. 10,109,685, issued Oct. 23, 2018, which in turn is a continuation of application Ser. No. 14/712,190, filed May 14, 2015, now U.S. Pat. No. 9,722,001, issued Aug. 1, 2017, the entire contents of all being hereby incorporated by reference.

Korean Patent Application No. 10-2014-0175994, filed on Dec. 9, 2014, in the Korean Intellectual Property Office, and entitled: "Organic Light Emitting Display and Manufacturing Method Thereof," is incorporated by reference herein in its entirety.

BACKGROUND

1. Field

Provided are an organic light emitting display and a manufacturing method thereof.

2. Description of the Related Art

An organic light emitting display may be used in a small mobile device such as a smart phone in addition to being applied to a large-sized TV with a large screen.

SUMMARY

Embodiments may be realized by providing an organic light emitting display, including a substrate; a first electrode and a second electrode above the substrate and facing each other; at least two organic light emitting layers between the first electrode and the second electrode; and at least two color filters on the second electrode, the organic light emitting layers emitting a first color light, and the color filters emitting a second color light and a third color light.

The first color light may be blue light.

The color filters may include a quantum dot material.

The color filters may include a first color filter and a second color filter, and the first color filter may emit the second color light, and the second color filter may emit the third color light.

The second color light may be green light and the third color light may be red light.

Each of the color filters may include a first region adjacent to the second electrode and a second region, and the quantum dot material may be in the second region.

The organic light emitting display may further include a charge generating layer between the at least two organic light emitting layers.

The charge generating layer may include an n-type charge generating layer and a p-type charge generating layer.

The n-type charge generating layer may be adjacent to the first electrode, and the p-type charge generating layer may be adjacent to the second electrode.

The first electrode may be an anode, and the second electrode may be a cathode.

The organic light emitting layers may include a soluble material.

The organic light emitting display may further include an n-type charge generating layer between the second electrode and the light emitting layers.

The organic light emitting display may further include a buffer layer between the second electrode and the light emitting layers. The buffer layer may include one or more of $WO_3$, $MoO_x$, or hexaazatriphenylenehexacarbonitrile (HATCN).

The organic light emitting display may further include a sealing substrate sealing the organic light emitting display. The color filters may be between the sealing substrate and the second electrode.

The sealing substrate may include a transparent material, and light emitted from the organic light emitting layers may be emitted through the sealing substrate.

Embodiments may be realized by providing a manufacturing method of an organic light emitting display, including forming a first electrode above a substrate; forming at least two organic light emitting layers above the first electrode with a charge generating layer between the organic light emitting layers; and forming a second electrode above the at least two organic light emitting layers, the organic light emitting layers being formed using a soluble material.

The manufacturing method may further include one or more of forming one or more of a hole injection layer or a hole transport layer between the first electrode and the organic light emitting layers to supply holes generated from the first electrode to the organic light emitting layers; or forming one or more of an electron injection layer or an electron transport layer between the second electrode and the organic light emitting layers to supply electrons generated from the second electrode to the organic light emitting layers.

The organic light emitting layers may be formed under conditions of normal pressure.

The manufacturing method may further include forming a buffer layer including one or more of $WO_3$, $MoO_x$, or 1,4,5,8,9,11-hexaazatriphenylenehexacarbonitrile (HATCN) below the second electrode.

The manufacturing method may further include preparing a sealing substrate on which at least two color filters including a quantum dot material are formed; and laminating the substrate and the sealing substrate with the at least two color filters facing the second electrode.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
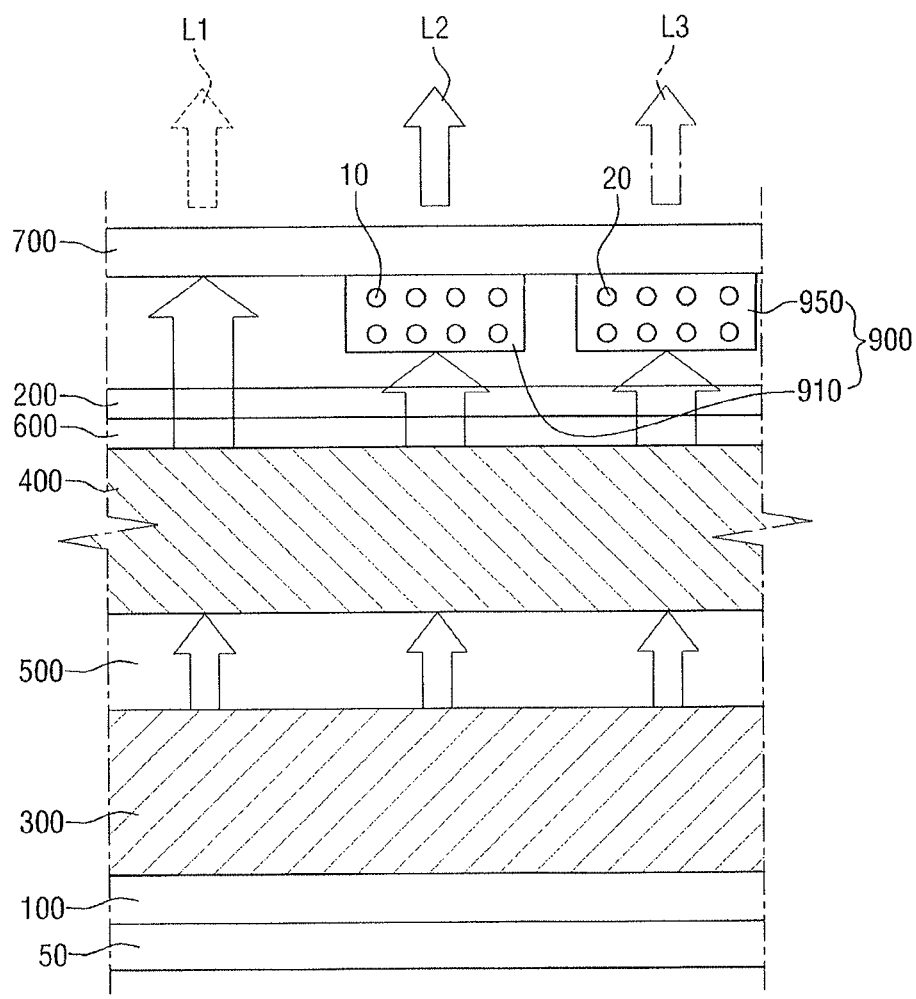
FIG. 1 illustrates a schematic cross-sectional view of an organic light emitting display according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Although the terms "first, second, and so forth" are used to describe diverse constituent elements, such constituent elements are not limited by the terms. The terms are used only to discriminate a constituent element from another constituent element. Accordingly, in the following description, a first constituent element may be a second constituent element.

Hereinafter, embodiments will be described with reference to the accompanying drawings.

FIG. 1 illustrates a cross-sectional view of an organic light emitting display according to an embodiment.

Referring to FIG. 1, an organic light emitting display according to an embodiment may include a substrate 50, a first electrode 100 and a second electrode 200 disposed above the substrate 50 to face, e.g., be separated from, each other, at least two organic light emitting layers 300 and 400 located between the first electrode 100 and the second electrode 200, and at least two color filters 900 located on the second electrode 200. The organic light emitting layers 300 and 400 may emit a first color light L1, and the color filters 900 may emit a second color light L2 and a third color light L3, respectively.

The substrate 50 may include an insulating substrate. If the organic light emitting display is a front emission type display, a semi-transparent or non-transparent substrate may be used as the insulating substrate.

The insulating substrate may be made of a material such as glass, quartz, and polymeric resin. Examples of the polymer material may include polyethersulphone (PES), polyacrylate (PA), polyarylate (PAR), polyetherimide (PEI), polyethylene napthalate (PEN), polyethylene terepthalate (PET), polyphenylene sulfide (PPS), polyallylate, polyimide (PI), polycarbonate (PC), cellulose triacetate (CAT or TAC), cellulose acetate propionate (CAP) and a combination thereof. In some embodiments, the insulating substrate may be a flexible substrate made of a flexible material such as polyimide (PI).

Although not shown, the substrate 50 may further include other structures disposed on the insulating substrate. Examples of the other structures may include a wiring, an electrode, and an insulating film. In some embodiments, the substrate 50 may include a plurality of thin film transistors arranged on an insulating substrate. The drain electrodes of some of the thin film transistors may be connected electrically to the first electrode 100. The thin film transistor may include an active region made of, for example, amorphous silicon, polycrystalline silicon, or single crystalline silicon. In embodiments, the thin film transistor may include an active region containing an oxide semiconductor.

The first electrode 100 may be disposed on the substrate 50, and the first electrode 100 may be disposed in each pixel of the organic light emitting display. The first electrode 100 may be an anode, and the first electrode 100 may include a conductive material that may have a relatively large work function compared to the second electrode 200. For example, the first electrode 100 may include Indium-Tin-Oxide (ITO), Indium-Zinc-Oxide (IZO), Zinc Oxide (ZnO), or Indium Oxide ($In_2O_3$). The above-mentioned conductive materials may have a transparent property as well as a relatively large work function.

In addition to the above-mentioned conductive materials, a reflective material such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca) or a mixture thereof may be further included in the first electrode 100. The first electrode 100 may have a single layer structure formed of the above-mentioned conductive material and reflective material, or may have a multilayer structure formed by stacking plural layers. For example, the first electrode 100 may have a multilayer structure of ITO/Mg, ITO/MgF, ITO/Ag, or ITO/Ag/ITO.

The second electrode 200 may be a cathode, and may be a front electrode or common electrode formed regardless of pixels. The second electrode 200 may include a conductive material that may have a relatively low work function compared to the first electrode 100.

The second electrode 200 may include Li, Ca, LiF/Ca, LiF/Al, Al, Mg, Ag, Pt, Pd, Ni, Au Nd, Ir, Cr, BaF, Ba, or a compound or mixture thereof (e.g., a mixture of Ag and Mg). The second electrode 200 may further include an auxiliary electrode. The auxiliary electrode may further include a film formed by depositing the material, and transparent metal oxide, formed on the film, for example, Indium-Tin-Oxide (ITO), Indium-Zinc-Oxide (IZO), Zinc Oxide (ZnO), Indium-Tin-Zinc-Oxide, or $MnO_2$.

As the second electrode 200, a conductive layer that may have a small work function may be formed as a thin film, and a transparent conductive film, for example, an Indium-Tin-Oxide (ITO) layer, an Indium-Zinc-Oxide (IZO) layer, a Zinc Oxide (ZnO) layer, or an Indium Oxide ($In_2O_3$) layer, may be stacked thereon.

As described above, the second electrode 200 may be formed of a transparent conductive material, the light generated from the organic light emitting layers 300 and 400 may be emitted forward through the second electrode 200, and it may be possible to implement a front emission type organic light emitting display.

The first color light L1 may be blue light. For example, the organic light emitting layers 300 and 400 emitting the first color light L1 may be blue organic light emitting layers. The organic light emitting layers 300 and 400 may include a soluble material, and in a manufacturing process of an organic light emitting display, which will be described later, the organic light emitting layers may be formed by an ink-jet printing method or a discharging method using a slit nozzle without using a deposition method. In the case of the deposition method, the unit price of the product may be increased, for example, due to an expensive deposition apparatus. In the case of forming the organic light emitting layers by using a soluble material, an inexpensive apparatus may be used, and it may be possible to reduce the unit price of the product.

By forming at least two organic light emitting layers 300 and 400, it may be possible to emit a large amount of light. For example, as shown in FIG. 1, the organic light emitting layers 300 and 400 may include a first organic light emitting layer 300 and a second organic light emitting layer 400. Blue light may be emitted from the first organic light emitting layer 300 and the second organic light emitting layer 400, and it may be possible to increase the luminous efficiency of the organic light emitting display by increasing the amount of light emitted. Illustrated is an embodiment including organic light emitting layers, i.e., the organic light emitting layers 300 and 400. If a larger amount of light emitted is required, another organic light emitting layer, e.g., a third organic light emitting layer (not shown) or a fourth organic light emitting layer (not shown), may be added, and these layers may be organic light emitting layers that emit blue light.

Holes may be provided from the first electrode 100 and electrons may be provided from the second electrode 200, the provided holes and electrons may be coupled with each other in the organic light emitting layers 300 and 400 located between the first electrode 100 and the second electrode 200, and light may be generated by the energy generated when exitons formed by the coupling fall to the ground state.

The color filters 900 may allow the light provided from the organic light emitting layers 300 and 400 to be emitted as the second color light L2 or the third color light L3. For example, the color filters 900 may convert the first color light L1 provided from the organic light emitting layers 300 and 400 into the second color light L2 or the third color light L3.

The color filters 900 may include a first color filter 910 and a second color filter 950. The first color filter 910 may emit the second color light L2, and the second color filter 950 may emit the third color light L3. The second color light L2 may be green light and the third color light L3 may be red light. The color filters 910 and 950 may be formed only in some regions of the upper side of the organic light emitting layers 300 and 400, and may not be formed in some regions of the upper side thereof. For example, as shown in FIG. 1, the first color filter 910 and the second color filter 950 may be formed at some positions above the organic light emitting layers 300 and 400, and the color filters may not be formed at some positions above the organic light emitting layers 300 and 400. The first color light L1 that may be blue light may be emitted directly at the position at which the color filter is not formed, and the blue light passing through the first color filter 910 may be converted into the second color light L2 and emitted as green light. The blue light passing through the second color filter 950 may be converted into the third color light L3 and emitted as red light.

The organic light emitting display may include a sealing substrate 700, and the sealing substrate 700 may seal (cap) the organic light emitting display while preventing various organic layers constituting the organic light emitting display from being damaged by being exposed to the outside. The sealing substrate 700 may be formed of a transparent material, and the light emitted from the organic light emitting layers 300 and 400 may be emitted through the sealing substrate 700. As described above, the sealing substrate 700 and the second electrode 200 may be formed of a transparent material, and light may be freely emitted through the front surface of the organic light emitting display.

The above-described color filters 900 may be formed on, for example, the sealing substrate 700, and the color filters 900 may be formed directly on the second electrode 200.

The color filters 900 may include quantum dot materials 10 and 20. Quantum dots refer to semiconductor nanoparticles that may have a size of several nm to several tens nm, and may have characteristics that emission light varies depending on the size of the particles by a quantum confinement effect. For example, the quantum dots may generate strong light in a narrow wavelength band, and light emitted from the quantum dots may be generated when the electrons in an unstable (excited) state fall from a conduction band to a valence band. The quantum dots may have a property that generates light having a short wavelength as the particles are smaller, and generates light having a long wavelength as the particles are larger. By adjusting the size of the quantum dots, it may be possible to generate light having a desired wavelength in a visible light region. Therefore, it may be possible to obtain light of a desired wavelength by adjusting the size of the quantum dot materials 10 and 20.

The quantum dot materials 10 and 20 may have a particle size of 10 nm or less. For example, the quantum dot materials may emit red light if the particle size ranges from 55 to 65 Å, may emit green light if the particle size ranges from 40 to 50 Å, and may emit blue light if the particle size ranges from 20 to 35 Å. The quantum dot materials may emit yellow light if the particle size is intermediate between those of the quantum dot material emitting red light and the quantum dot material emitting green light. By including the quantum dot materials in the color filters 900, it may be possible to increase the color purity.

The quantum dot materials 10 and 20 may include silicon (Si)-based nano crystals, Group II-VI-based compound semiconductor nano crystals, Group III-V-based compound semiconductor nano crystals, Group IV-VI-based compound semiconductor nano crystals, and mixtures thereof.

The Group II-VI-based compound semiconductor nano crystals may be formed of one selected from CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZnSTe, CdHgSeS, CdHgSeTe, CdHgSTe, HgZnSeS, HgZnSeTe and HgZnSTe.

The Group III-V-based compound semiconductor nano crystals may be formed of one selected from GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs.

The Group IV-VI-based compound semiconductor nano crystals may be formed of SbTe.

Each of the color filters 900 may emit desired light, but may emit light having higher purity if the quantum dot materials 10 and 20 are included in the color filters 900 as described above. For example, in the case of the color filters 900 including the first color filter 910 and the second color filter 950, if the first color filter 910 emits green light and the second color filter 950 emits red light, the first color filter 910 may include the quantum dot material 10 corresponding to the wavelength range of 500 nm to 570 nm, which is a green light wavelength range. The second color filter 950 may include the quantum dot material 20 corresponding to the wavelength range of 600 nm to 670 nm, which is a red light wavelength range.

Although not separately shown, an n-type charge generating layer may be further included between the second electrode 200 and the light emitting layers 300 and 400 to impart the conductivity between the second electrode 200 and the light emitting layers 300 and 400.

A buffer layer 600 may be further included between the second electrode 200 and the light emitting layers 300 and 400. For example, the buffer layer 600 may include one or more of $WO_3$, $MoO_x$, or hexaazatriphenylenehexacarbonitrile (HATCN). The second electrode 200 may be formed by a deposition method or a sputtering method by using a material such as an inorganic material. Various kinds of organic layers located therebelow may be damaged, or their functions may be deteriorated. By forming the buffer layer 600, it may be possible to prevent the deterioration of the functions by the second electrode. If the n-type charge generating layer is further included, the buffer layer 600 may be located between the second electrode 200 and the n-type charge generating layer.

The organic light emitting display may further include a charge generating layer 500 located between at least two organic light emitting layers 300 and 400. The charge generating layer 500 may include an n-type charge generating layer and a p-type charge generating layer.

The p-type charge generating layer may generate holes and electrons. The generated holes may be injected into the organic light emitting layer 400 adjacent on, e.g., to, the upper side, and the generated electrons may be injected into the n-type charge generating layer and then injected into the organic light emitting layer 300 adjacent on, e.g., to, the lower side.

The n-type charge generating layer may inject the electrons generated from the p-type charge generating layer into the organic light emitting layer 300 on the lower side. The n-type charge generating layer may be made of the same material as that of an electron transport layer, which will be described later.

Figure 2:
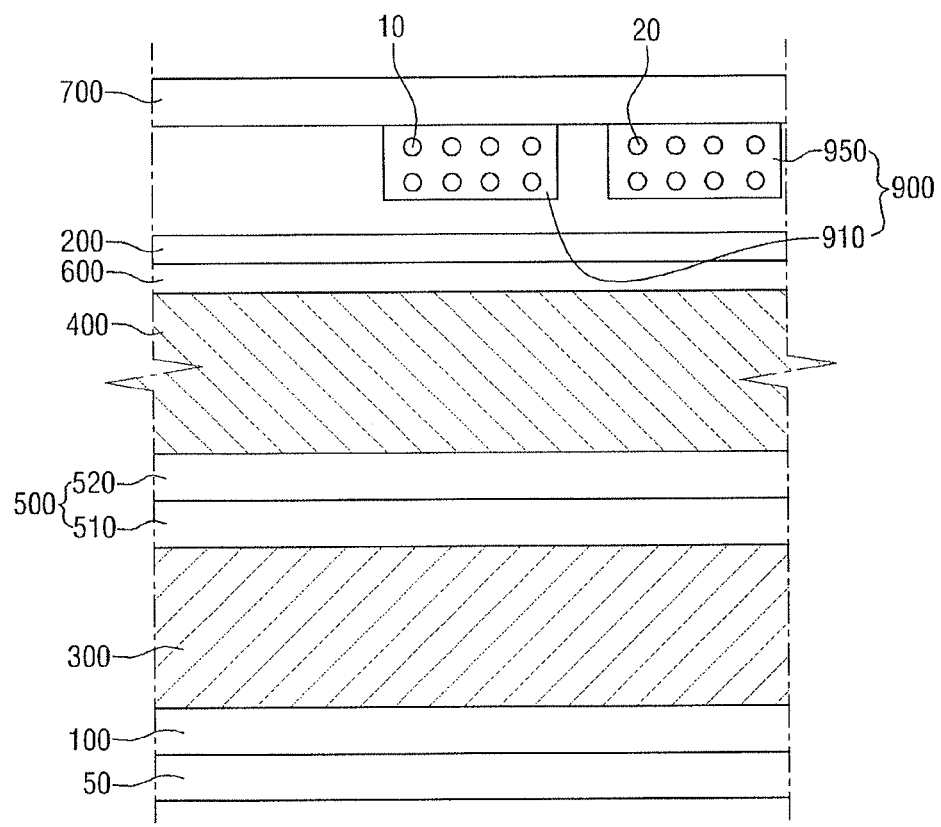
FIG. 2 illustrates a schematic cross-sectional view of an organic light emitting display according to an embodiment.

FIG. 2 illustrates a cross-sectional view of an organic light emitting display according to an embodiment. As shown in FIG. 2, the charge generating layer 500 may include an n-type charge generating layer 510 and a p-type charge generating layer 520, which are separated from each other. The n-type charge generating layer 510 may be located adjacent to the first electrode 100, e.g., relative to the p-type charge generating layer 520, and the p-type charge generating layer 520 may be located adjacent to the second electrode 200, e.g., relative to the n-type charge generating layer 510. The n-type charge generating layer 510 may be formed in contact with the organic light emitting layer 300 located on the lower side, and the p-type charge generating layer 520 may be formed in contact with the organic light emitting layer 400 located on the upper side. The n-type charge generating layer 510 and the p-type charge generating layer 520 may be formed in contact with each other.

The other configurations may be the same as described above, and a more detailed description will be omitted.

Figure 3:
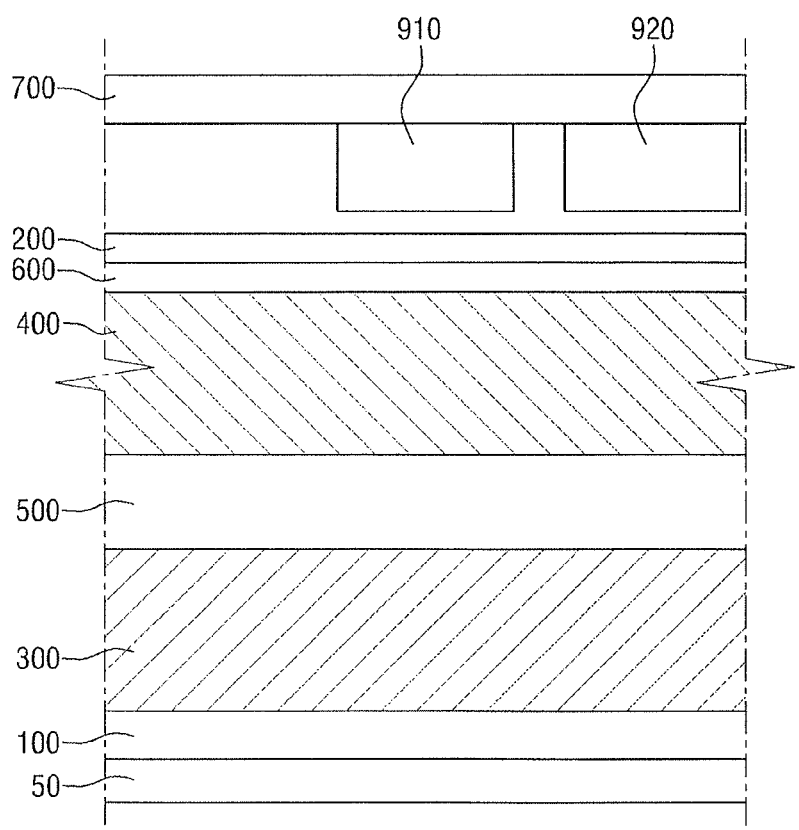
FIG. 3 illustrates a schematic cross-sectional view of an organic light emitting display according to an embodiment.
Figure 4:
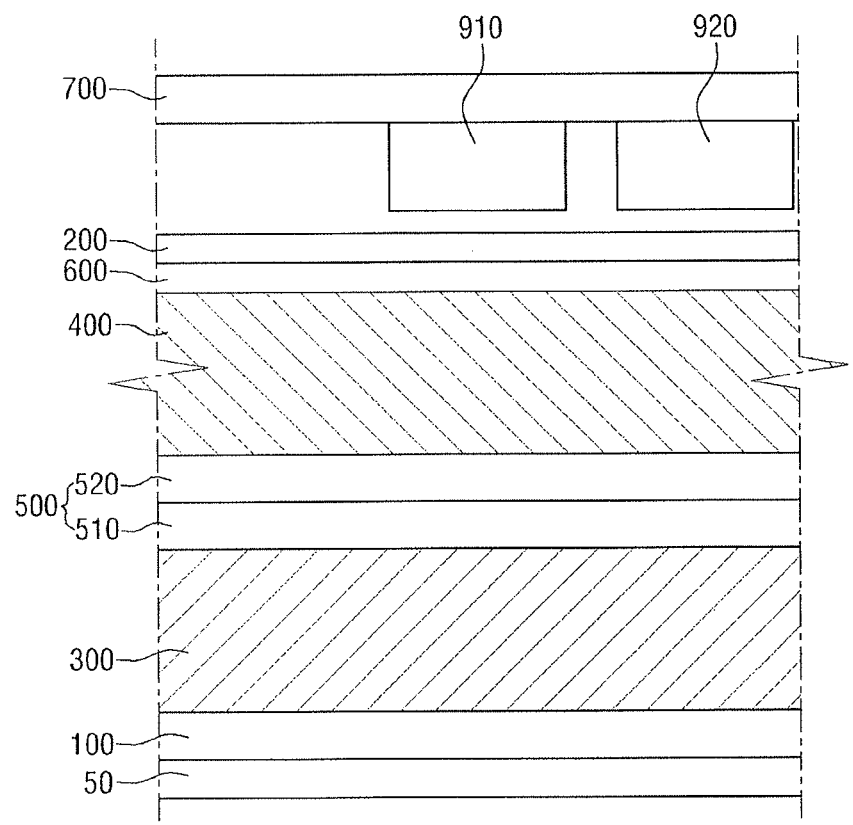
FIG. 4 illustrates a schematic cross-sectional view of an organic light emitting display according to an embodiment.

FIGS. 3 and 4 illustrate cross-sectional views of an organic light emitting display according to an embodiment. In the organic light emitting display of FIGS. 3 and 4, the quantum dot materials may be removed from the organic light emitting display of FIGS. 1 and 2. As shown in FIGS. 3 and 4, the quantum dot materials may not be included in the color filters 910 and 950.

The other configurations may be the same as described above, and a repeated description will be omitted.

Figure 5:
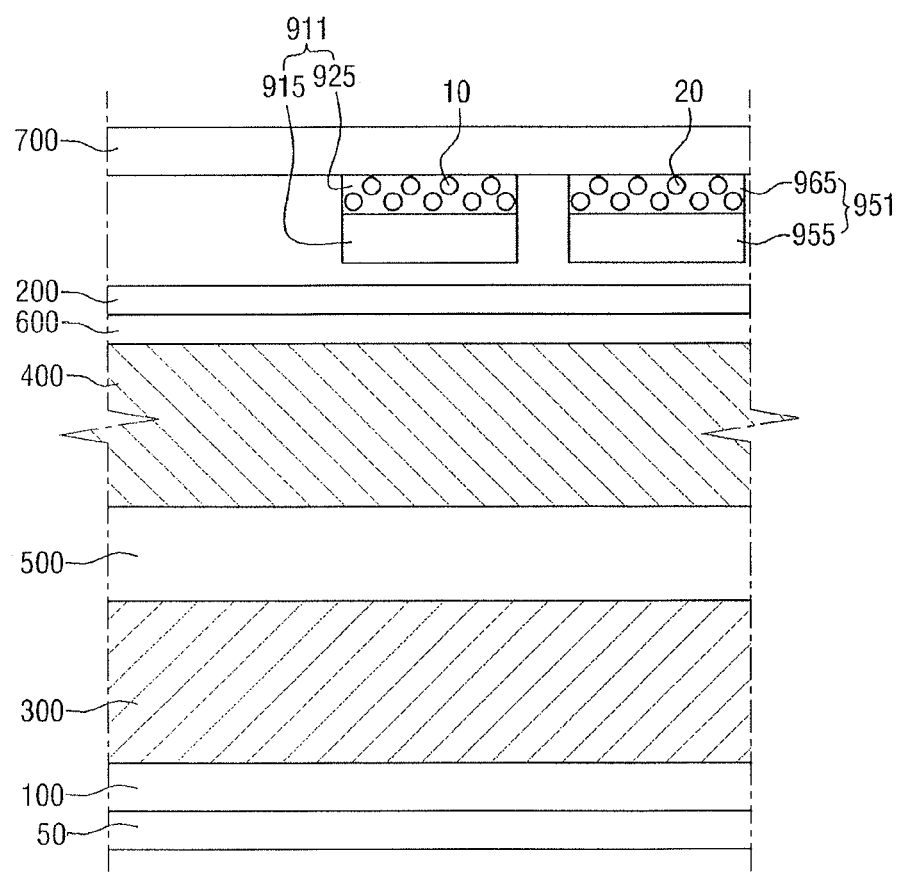
FIG. 5 illustrates a schematic cross-sectional view of an organic light emitting display according to an embodiment.

FIG. 5 illustrates a cross-sectional view of an organic light emitting display according to an embodiment. Referring to FIG. 5, color filters 911 and 951 may include first regions 915 and 955 adjacent to the second electrode 200, and second regions 925 and 965. For example, the color filter 911 (951) may include the first region 915 (955) and the second region 925 (965), which are separated from each other. The second regions 925 and 965 may be formed adjacent to the sealing substrate 700, or in contact with the sealing substrate 700.

The first color filter 911 may be divided into the first region 915 and the second region 925, and the second color filter 951 may be divided into the first region 955 and the second region 965.

The quantum dot materials 10 and 20 may be located only in the second regions 925 and 965. For example, the quantum dot materials 10 and 20 may be formed at positions, adjacent to the sealing substrate 700, in the respective color filters 911 and 951 to help increase color conversion efficiency. By forming the quantum dot materials 10 and 20 to be close to the sealing substrate 700, it may be possible to prevent the mixing of colors between the second color light L2 and the third color light L3, and high-purity colors may be implemented.

In an embodiment, the quantum dot materials 10 and 20 may be located inside the color filters and may have a constant concentration gradient. The concentration gradient may be set such that the quantum dot materials have a higher concentration as they are closer to the sealing substrate.

Figure 6:
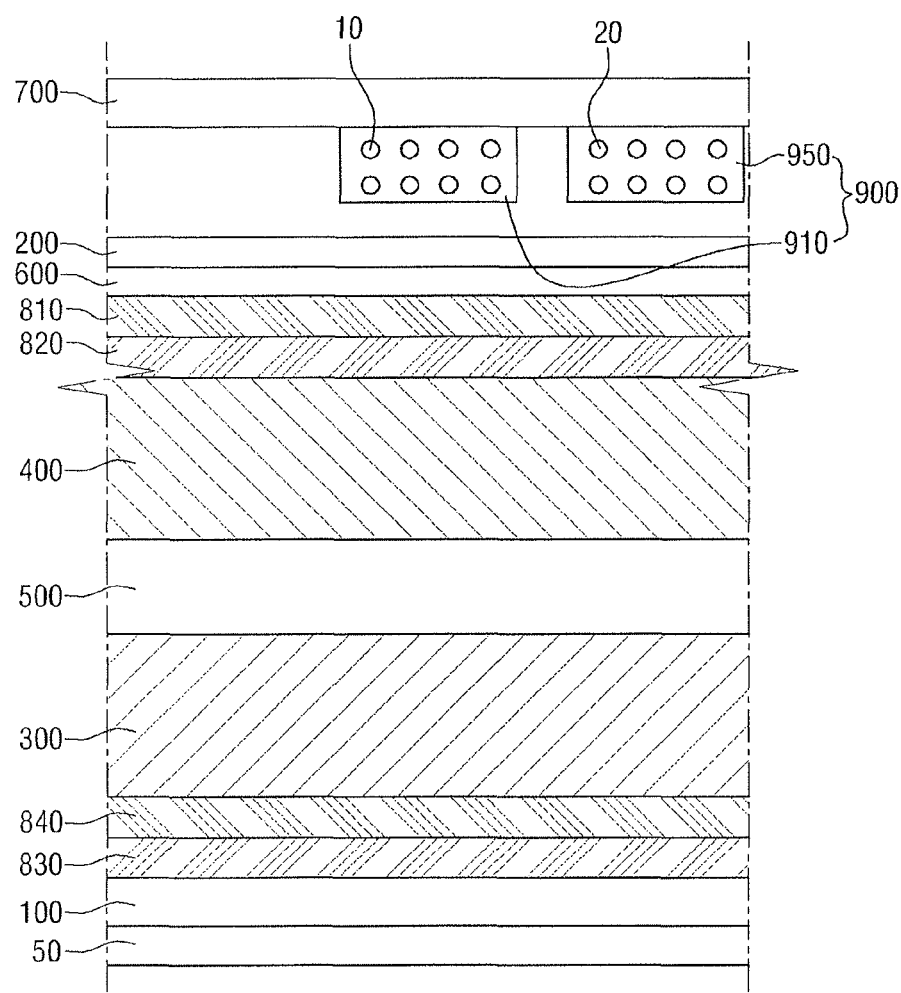
FIG. 6 illustrates a schematic cross-sectional view of an organic light emitting display according to an embodiment.

FIG. 6 illustrates a cross-sectional view of an organic light emitting display according to an embodiment.

Referring to FIG. 6, the organic light emitting display may include a first charge transfer region 830 and 840 located between the first electrode 100 and the organic light emitting layer 300 and a second charge transfer region 810 and 820 located between the second electrode 200 and the organic light emitting layer 400. Any one of the first charge transfer region 830 and 840 and the second charge transfer region 810 and 820 may be responsible for the transfer of holes, and the other one thereof may be responsible for the transfer of electrons.

In this embodiment, the first electrode 100 may be an anode electrode and the second electrode 200 may be a cathode electrode. The first charge transfer region 830 and 840 adjacent to the anode electrode may be a hole transfer region, and the second charge transfer region 810 and 820 adjacent to the cathode electrode may be an electron transfer region.

The first charge transfer region 830 and 840 may have a single layer structure made of a single material or different materials, or a multilayer structure including plural layers made of different materials. In an embodiment, the first charge transfer region 830 and 840 may further include a buffer layer and a first charge blocking layer. In an embodiment, any one of the hole injection layer 830 and the hole transport layer 840 may be omitted, or the hole injection layer 830 and the hole transport layer 840 may be configured as a single layer.

The hole injection layer 830 may be disposed on the first electrode 100, and may increase the efficiency of hole injection into the organic light emitting layers 300 and 400 from the first electrode 100. For example, the hole injection layer 830 may decrease an energy barrier, and may allow the holes to be injected efficiently.

The hole injection layer 830 may include, for example, a phthalocyanine compound such as copper phthalocyanine (CuPc), m-MTDATA(4,4',4"-tris(N-3-methylphenyl-N-phenylamino)triphenylamine), TDATA(4,4',4''-tris(diphenylamino)triphenylamine),
2-TNATA(4,4',4''-tris[2-naphthyl(phenyl)-amino]triphenylamine),
Pani/DBSA(Polyaniline/Dodecylbenzenesulfonic acid), PEDOT/PSS(Poly(3,4-ethylene dioxythiophene)/Polystyrene sulfonate), PANI/CSA (Polyaniline/Camphorsulfonic acid), or PANI/PSS (Polyaniline/Polystyrene sulfonate).

The hole transport layer 840 may be disposed on the hole injection layer 830 and may transport the holes injected into the hole injection layer 830 to the organic light emitting layers 300 and 400. When the highest occupied molecular energy (HOMO) of the hole transport layer 840 is substantially lower than the work function of a material forming the first electrode 100, and is substantially higher than the HOMO of the organic light emitting layers 300 and 400, the hole transport efficiency may be optimized. The hole transport layer 840 may include, for example,
NPD(4,4'-bis[N-(1-napthyl)-N-phenyl-amino] biphenyl),
TPD(N,N'-diphenyl-N,N'-bis[3-methylphenyl]-1,1'-biphenyl-4,4'-diamine),
s-TAD(2,2',7,7'-tetrakis-(N,N-diphenylamino)-9,9'-spirobifluoren), or
m-MTDATA(4,4',4''-tris(N-3-methylphenyl-N-phenylamino)triphenylamine).

The first charge transfer region 830 and 840 may further include a charge generating material to improve conductivity in addition to the above-mentioned materials. The charge generating material may be distributed uniformly or non-uniformly in the first charge transfer region 830 and 840. The charge generating material may be, for example, a p-dopant. The p-dopant may be, for example, one of a quinone derivative, metal oxide and a cyano group-containing compound. Examples of the p-dopant may include a quinone derivative such as
TCNQ (Tetracyanoquinodimethane) and TCNQ (Tetracyanoquinodimethane), and metal oxide such as tungsten oxide and molybdenum oxide.

As described above, the first charge transfer region 830 and 840 may further include at least one of the buffer layer and the first charge blocking layer. The buffer layer may increase the light emission efficiency by compensating for a resonance distance according to the wavelength of light emitted from the organic light emitting layers 300 and 400. As a material included in the buffer layer, a material that may be included in the first charge transfer region 830 and 840 may be used. The first charge blocking layer may prevent the injection of charges into the first charge transfer region 830 and 840 from the second charge transfer region 810 and 820.

The organic light emitting layers 300 and 400 may be disposed on the first charge transfer region 830 and 840. The organic light emitting layers 300 and 400 may be made of a material that may be used for light emitting layers. For example, the organic light emitting layers 300 and 400 may be made of materials emitting red, green and blue light. In an embodiment, the organic light emitting layers 300 and 400 may be made of a material emitting blue light. The organic light emitting layers 300 and 400 may include a fluorescent material or phosphorescent material.

In an exemplary embodiment, the organic light emitting layers 300 and 400 may include a host and a dopant.

As the host, for example, Alq3(tris-(8-hydroyquinolato) aluminum(III)),
CBP(4,4'-N,N'-dicarbazole-biphenyl), PVK(poly(N-vinylcarbazole)),
ADN(9,10-Bis(2-naphthalenyl)anthracene),
TCTA(4,4',4''-tris(Ncarbazolyl)triphenylamine),
TPBi(1,3,5-tris(N-phenylbenzimiazole-2-yl)benzene),
TBADN(2-(t-butyl)-9,
10-bis (20-naphthyl) anthracene), DSA(distyrylarylene),
CDBP(4,4'-Bis(9-carbazolyl)-2,2'-Dimethyl-biphenyl), or
MADN(2-Methyl-9,10-bis(naphthalen-2-yl)anthracene)
may be used.

As the dopant, both a fluorescent dopant and a phosphorescent dopant may be used. The kind of the dopant may vary according to the light emission color of the organic light emitting layers 300 and 400.

As the red dopant, for example, a fluorescent material including
PBD:Eu(DBM)3(Phen)(2-biphenyl-4-yl-5-(4-t-butylphenyl)-1,3,4-oxadiazole:Tris(dibenzoylmethane) mono(1,10-phenanthroline)europium(III)) or perylene may be used. In an embodiment, a phosphorescent material including a metal complex such as PIQIr(acac)(bis(1-phenylisoquinoline)acetylacetonate iridium),
PQIr(acac)(bis(1-phenylquinoline)acetylacetonate iridium),
PQIr(tris(1-phenylquinoline)iridium) and PtOEP(octaethylporphyrin platinum) or an organometallic complex may be used.

As the green dopant, for example, a fluorescent material including
Alq3(tris-(8-hydroyquinolato) aluminum(III)) may be used. In an embodiment, a phosphorescent material including, for example,
Ir(ppy)3(fac tris(2-phenylpyridine)iridium),
Ir(ppy)2(acac)(Bis(2-phenylpyridine)(acetylacetonate) iridium(III)), or
Ir(mpyp)3(2-phenyl-4-methyl-pyridine iridium), may be used.

As the blue dopant, for example, a fluorescent material including one of spiro-DPVBi(spiro-4,'-bis(2,2'-diphenylvinyl)1,1'-biphenyl), spiro-6P(spiro-sixphenyl), DSB (distyrylbenzene), DSA(distyrylarylene), PFO(polyfluorene)-based polymer and PPV(poly p-phenylene vinylene))-based polymer may be used. In an embodiment, a phosphorescent material including, for example,
F2Irpic(bis[2-(4,6-difluorophenyl)pyridinato-N,C2']iridium picolinate),
(F2ppy)2Ir(tmd)(bis[2-(4,6-difluorophenyl)pyridinato-N,C2']iridium
2,2,6,6-tetramethylheptane-3,5-dione), or
Ir(dfppz)3(tris[1-4,6-difluorophenyl)pyrazolate-N,C2'] iridium), may be used.

The second charge transfer region 810 and 820 may be disposed on the organic light emitting layers 300 and 400. The second charge transfer region 810 and 820 may have a single layer structure made of a single material or different materials, or a multilayer structure including plural layers made of different materials. In an embodiment, the second charge transfer region 810 and 820 may further include a second charge blocking layer. As illustrated in the figure, the second charge transfer region 810 and 820 may include an electron transport layer 820 and an electron injection layer 810. In an embodiment, any one of the electron transport layer 820 and the electron injection layer 810 may be omitted, or the electron transport layer 820 and the electron injection layer 810 may be configured as a single layer.

The electron transport layer 820 may be disposed on the organic light emitting layers 300 and 400, and may transport electrons injected from the electron injection layer 810 toward the organic light emitting layers 300 and 400.

The electron transport layer 820 may include, for example, Alq3(tris-(8-hydroyquinolato) aluminum(III)), TPBi(1,3,5-tris(N-phenylbenzimiazole-2-yl)benzene), BCP (2,9-dimethyl-4,7-diphenyl-1,10-phenanthroline), Bphen(4,7-diphenyl-1,10-phenanthroline), TAZ(3-(Biphenyl-4-yl)-5-(4-tert-butylphenyl)-4-phenyl-4H-1,2,4-triazole), NTAZ(4-(naphthalen-1-yl)-3,5-diphenyl-4H-1,2,4-triazole), tBu-PBD(2-(4-biphenylyl)-5-(4-tert-butyl-phenyl)-1,3,4-oxadiazole), BAlq(Bis(2-methyl quinolrate-N1,O8)-(1,1'-Biphenyl-4-olato)aluminum), Bebq2(Bis(10-hydroxybenzo[h]quinolinato)beryllium), ADN(9,10-bis(2-naphthyl)anthracene) or a mixture thereof.

The electron injection layer 810 may be disposed on the electron transport layer 820, and may increase the efficiency of electron injection into the organic light emitting layers 300 and 400 from the second electrode 200.

As the electron injection layer 810, for example, lanthanide metal such as LiF, LiQ (lithium quinolrate), $Li_2O$, BaO, NaCl, CsF and Yb, or halide metal such as RbCl and RbI may be used. The electron injection layer 810 may also be made of a mixture of the above-mentioned material and organo metal salt that may have an insulating property. The organo metal salt may be a material that may have an energy band gap of about 4 eV or more. For example, the organo metal salt may include metal acetate, metal benzoate, metal acetoacetate, metal acetylacetonate or metal stearate.

As mentioned above, the second charge transfer region 810 and 820 may further include the second charge blocking layer. The second charge blocking layer may include one or more of, for example, BCP(2,9-dimethyl-4,7-diphenyl-1,10-phenanthroline) or Bphen(4,7-diphenyl-1,10-phenanthroline).

Provided is a manufacturing method of an organic light emitting display. Hereinafter, a manufacturing method of an organic light emitting display will be described with reference again to FIGS. 1 to 6.

The manufacturing method of an organic light emitting display may include forming the first electrode 100 above the substrate 50, forming at least two organic light emitting layers 300 and 400 above the first electrode 100 while the charge generating layer 500 is interposed between the organic light emitting layers 300 and 400, and forming the second electrode 200 above the organic light emitting layers 300 and 400.

The organic light emitting layers may be formed using a soluble material. For example, the organic light emitting layers may be formed using a material containing a solvent. The organic light emitting layers may be formed by mixing a material forming the organic light emitting layers with a solvent, coating the mixed material and solvent by an ink-jet printing method or a discharging method using a slit nozzle, and then, performing a drying and baking step. Thus, it may be possible to simplify a manufacturing process, and it may be possible to reduce the unit price of the product by reducing the manufacturing cost. By forming at least two organic light emitting layers, it may be possible to increase the luminous efficiency.

The formation of the organic light emitting layers may be performed under conditions of normal pressure. For example, the formation of the organic light emitting layers may be performed under conditions of atmospheric pressure, or about 1 atmosphere. Since the formation of the organic light emitting layers may be performed under conditions of atmospheric pressure, it may not separately require conditions of vacuum or reduced pressure. Thus, it may be possible to manufacture the organic light emitting display without using an expensive manufacturing apparatus, and the unit price of the product may be reduced. In examples, other organic/inorganic layers in addition to the organic light emitting layers may be formed under conditions of normal pressure. Therefore, the overall manufacturing process of the organic light emitting display may be performed under conditions of normal pressure, and there may be an advantage of reducing the manufacturing cost while simplifying the manufacturing process. In an embodiment, the formation of the second electrode may be performed under conditions of reduced pressure or vacuum by a sputtering process.

The manufacturing method of an organic light emitting display may further include forming at least one of a hole injection layer and a hole transport layer between the first electrode and the organic light emitting layers to supply holes generated from the first electrode to the organic light emitting layers, and forming at least one of an electron injection layer and an electron transport layer between the second electrode and the organic light emitting layers to supply electrons generated from the second electrode to the organic light emitting layers. The hole transport layer, the hole injection layer, the electron transport layer and the electron injection layer have been already described in conjunction with the organic light emitting display, and a more detailed description will be omitted.

The manufacturing method of an organic light emitting display may further include forming a buffer layer including one or more of $WO_3$, $MoO_x$, or HATCN below the second electrode. The second electrode may be formed using the above-mentioned materials forming the second electrode by a sputtering method. The organic layers located between the first electrode and the second electrode may be damaged. By forming the buffer layer, in a process of forming the second electrode, it may be possible to prevent damage or performance degradation of various organic layers located between the first electrode and the second electrode, for example, due to the material forming the second electrode.

The manufacturing method of an organic light emitting display may further include preparing a sealing substrate on which at least two color filters including quantum dot materials are formed, and laminating the substrate and the sealing substrate while the color filters are located to face, e.g., be separated from, the second electrode. The quantum dot materials, the color filters, and the sealing substrate, for example, have been already described, and a redundant description will be omitted.

By way of summation and review, an organic light emitting display may be a self-luminous type display for displaying an image by using an organic light emitting diode that emits light. The organic light emitting display may be configured such that holes and electrons are injected by a first electrode and a second electrode, the injected holes and electrons are coupled in a light emitting layer located between the first electrode and the second electrode, and light may be generated by energy generated when exitons formed by the coupling fall to the ground state.

The organic light emitting diode may include, for example, a hole injection layer, a hole transport layer, an electron injection layer, and an electron transport layer, in addition to an organic light emitting layer between an anode and a cathode.

An organic light emitting diode that emits white light may be referred to as a white organic light emitting diode.

According to embodiments, it may be possible to provide an organic light emitting display that may be capable of improving color purity while preventing a change in color according to a viewing angle.

Also, it may be possible to provide a manufacturing method of an organic light emitting display, that may be capable of facilitating the manufacture and reducing the manufacturing cost.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display, comprising:
a first substrate;
a light emitting device disposed on the first substrate;
a quantum dot layer disposed on the first substrate, the quantum dot layer overlapping the light emitting device and including a quantum dot; and
a color filter layer disposed on the first substrate, the color filter layer overlapping the light emitting device and the quantum dot layer,
wherein the light emitting device includes:
a first electrode disposed on the first substrate,
a first light emitting layer disposed on the first electrode,
a second light emitting layer disposed on the first light emitting layer, and
a second electrode disposed on the second light emitting layer,
wherein the light emitting device further includes an electron injection layer between the second electrode and the second light emitting layer, wherein the electron injection layer includes one or more selected from LiF, LiQ (lithium quinolate), Li$_2$O, BaO, NaCl, CsF, Yb, RbCl, and RbI,
wherein the first light emitting layer and the second light emitting layer emit a blue color light, and
wherein the quantum dot layer and the color filter layer are spaced apart from the first electrode and the second electrode.

2. The display as claimed in claim 1, wherein the light emitting device further includes a charge generating layer between the first light emitting layer and the second light emitting layer.

3. The display as claimed in claim 2, wherein the charge generating layer includes an n-type charge generating layer and a p-type charge generating layer.

4. The display as claimed in claim 1, further comprising a second substrate facing the first substrate, wherein the quantum dot layer and the color filter layer are disposed between the second substrate and the second electrode.

5. The display as claimed in claim 1, wherein the quantum dot layer includes a first pattern including a first quantum dot and a second pattern including a second quantum dot, and
wherein a size of the first quantum dot is different from that of the second quantum dot.

6. A display, comprising:
a substrate;
a first electrode disposed on the substrate;
a second electrode facing the first electrode;
at least two light emitting layers between the first electrode and the second electrode, the at least two light emitting layers overlapping each other;
a quantum dot layer disposed on the substrate, the quantum dot layer including a quantum dot material and overlapping the at least two light emitting layers; and
a color filter layer disposed on the first substrate, the color filter layer overlapping the at least two light emitting layers and the quantum dot layer,
wherein the display further comprises a buffer layer between the second electrode and the at least two light emitting layers, and
wherein the quantum dot layer and the color filter layer are spaced apart from the first electrode and the second electrode.

7. The display as claimed in claim 6, wherein the buffer layer is an oxide layer.

8. The display as claimed in claim 6, wherein the at least two light emitting layers each emit a same kind of color light.

9. The display as claimed in claim 6, further comprising an electron injection layer between the second electrode and the at least two light emitting layers, wherein the electron injection layer includes one or more selected from LiF, LiQ (lithium quinolate), Li$_2$O, BaO, NaCl, CsF, Yb, RbCl, and RbI.

10. A display, comprising:
a substrate; and
a light emitting device disposed on the substrate,
wherein the light emitting device comprises,
a first electrode and a second electrode facing each other, and
at least two light emitting layers between the first electrode and the second electrode,
wherein the at least two of the light emitting layers emit a blue color light,
wherein the light emitting device further includes an electron injection layer between the second electrode and the at least two of the light emitting layers, wherein the electron injection layer includes one or more selected from LiF, LiQ (lithium quinolate), Li$_2$O, BaO, NaCl, CsF, Yb, RbCl, and RbI.

11. The display as claimed in claim 10,
wherein the at least two of the light emitting layers includes a first light emitting layer and a second light emitting layer overlapping the first light emitting layer, and
wherein the light emitting device further comprises a charge generating layer between the first light emitting layer and the second light emitting layer.

12. The display as claimed in claim 11, wherein the charge generating layer includes an n-type charge generating layer and a p-type charge generating layer.

13. The display as claimed in claim 10, wherein the first electrode comprises one or more selected from Indium-Tin-Oxide (ITO), Indium-Zinc-Oxide (IZO), Zinc Oxide (ZnO), Indium-Tin-Zinc-Oxide, and MnO$_2$.

14. The display as claimed in claim 10, wherein the second electrode comprises Li, Ca, LiF, Al, Mg, Ag, Pt, Pd, Ni, Au, Nd, Ir, Cr, BaF, Ba, or a mixture thereof.

15. A display, comprising:
a substrate;
a first electrode and a second electrode facing each other;
at least two light emitting layers between the first electrode and the second electrode;
an electron injection layer between the second electrode and the at least two light emitting layers; and
a buffer layer between the second electrode and the first electrode, the buffer layer overlapping the at least two light emitting layers, wherein the at least two light emitting layers emit a color of light that is substantially same as a color of light transmitted by the buffer layer.

16. The display as claimed in claim 15, wherein each of the at least two light emitting layers emits a blue color light.

* * * * *